United States Patent [19]

Swanson

[11] Patent Number: 4,580,111
[45] Date of Patent: * Apr. 1, 1986

[54] AMPLITUDE MODULATION USING DIGITALLY SELECTED CARRIER AMPLIFIERS

[75] Inventor: Hilmer I. Swanson, Quincy, Ill.

[73] Assignee: Harris Corporation, Melbourne, Fla.

[*] Notice: The portion of the term of this patent subsequent to Sep. 6, 2000 has been disclaimed.

[21] Appl. No.: 334,083

[22] Filed: Dec. 24, 1981

[51] Int. Cl.[4] ............................................. H03C 1/00
[52] U.S. Cl. ........................................ 332/41; 332/48; 332/31 R; 455/108
[58] Field of Search .................... 330/124 R; 332/9 R, 332/9 T, 31 R, 31 T, 37 R, 41, 47, 48, 59; 333/100, 101, 103; 375/41, 42; 455/103, 105, 108, 116

[56] References Cited

U.S. PATENT DOCUMENTS

| | | | |
|---|---|---|---|
| 3,243,728 | 3/1966 | Brainerd | 331/166 X |
| 3,480,881 | 11/1969 | Boykin | 332/9 R |
| 3,585,529 | 6/1971 | Darlington | 332/48 X |
| 3,805,191 | 4/1974 | Kawai et al. | 332/9 R |
| 3,845,392 | 10/1974 | Covill | 330/124 R X |
| 3,867,643 | 2/1975 | Baker et al. | 307/151 |
| 3,969,683 | 7/1976 | Fabricius | 330/124 R X |
| 4,156,212 | 5/1979 | Covill | 333/100 |
| 4,162,475 | 7/1979 | Fisher et al. | 367/137 |
| 4,164,714 | 8/1979 | Swanson | 332/31 R X |
| 4,205,241 | 5/1980 | Fisher et al. | 330/10 X |
| 4,399,558 | 8/1983 | Smollin | 332/9 R X |
| 4,403,197 | 9/1983 | Swanson | 455/108 X |

FOREIGN PATENT DOCUMENTS

| | | | |
|---|---|---|---|
| 7703261 | 8/1983 | France. | |
| 0044205 | 4/1981 | Japan | 332/41 |
| 0684719 | 9/1979 | U.S.S.R. | 455/103 |

OTHER PUBLICATIONS

Izumida, K. "Toshiba's 1-Tube 20/25 KW VHF TV and All Solid-State 5 KW AM Radio Transmitters Respond to User Demands" JEE, v. 18, n. 171, pp. 42–44 (Mar. 1981).
"Electronic Analog/Digital Conversions," (H. Schmid) Van Nostrand Reinhold Co., copyright 1970.

Primary Examiner—Eugene R. LaRoche
Assistant Examiner—Robert J. Pascal
Attorney, Agent, or Firm—Yount & Tarolli

[57] ABSTRACT

An amplitude modulator (10) is disclosed which generates an amplitude modulated carrier signal by selectively combining varying numbers of other carrier signals. A circuit (20) is included which provides plural carrier signals of like frequency and phase where the number of carrier signals being provided is dependent upon the level of an input signal. A combiner circuit (22) combines the plural carrier signals to thereby provide a combined signal which is the desired amplitude modulated carrier signal. In one embodiment (FIG. 3) the carrier signals which are combined are all equal in amplitude. In another embodiment (FIG. 4) the amplitudes of some of the carrier signals are weighted in a binary progression. In yet another embodiment (FIG. 9) the carrier signals are all frequency modulated whereby the output signal has both a varying frequency and amplitude.

48 Claims, 11 Drawing Figures

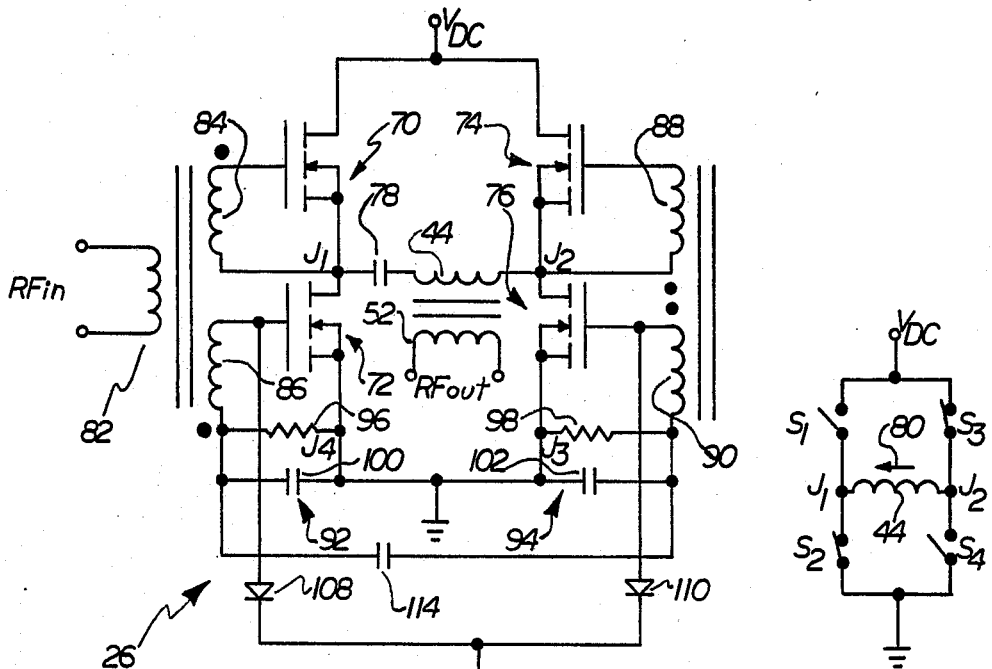
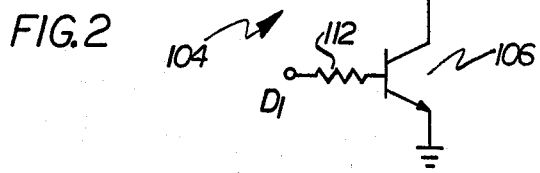
FIG.2  FIG.2A
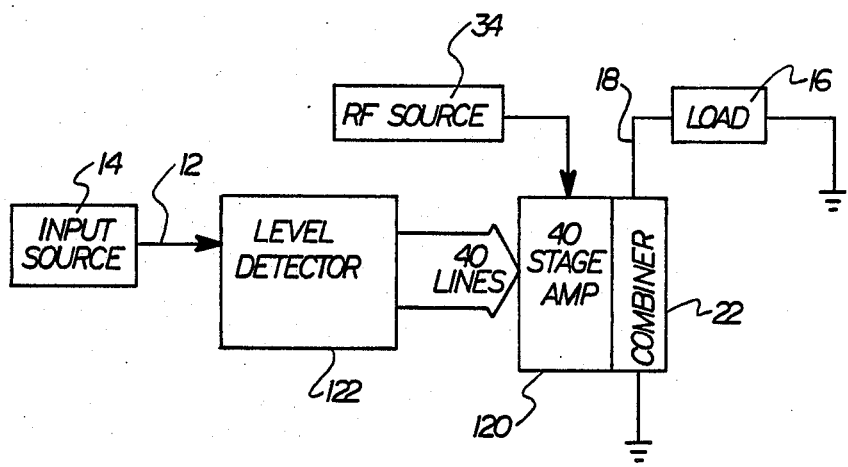
FIG.3

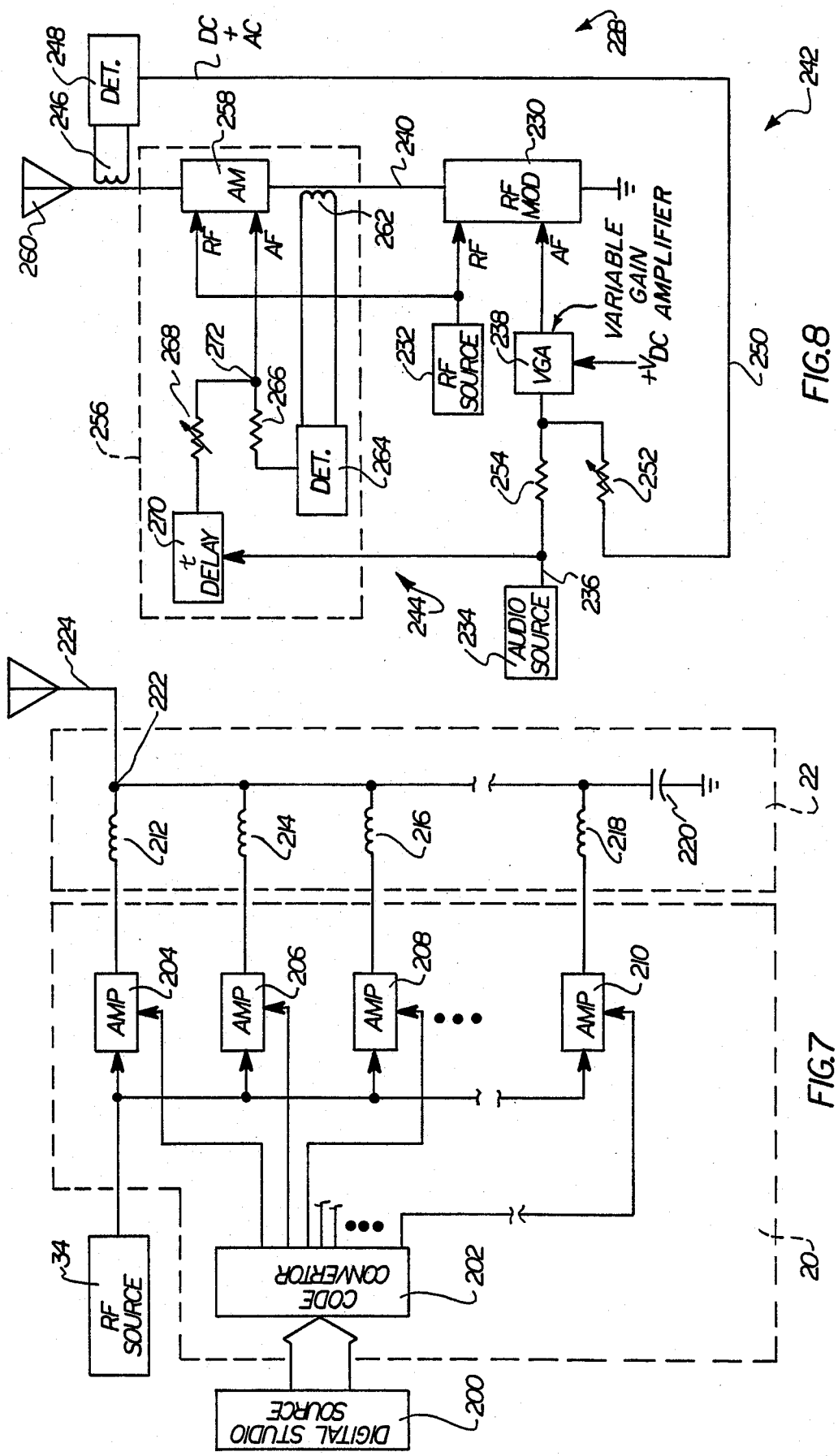

AMPLITUDE MODULATION USING DIGITALLY SELECTED CARRIER AMPLIFIERS

BACKGROUND AND FIELD OF THE INVENTION

The present invention relates to modulators, and more particularly to a circuit for generating an amplitude modulated carrier signal by selectively combining plural carrier signals.

In AM radio bradcasting, a high power vacuum tube is conventionally used in the final radio frequency (RF) amplifier stage of the transmitter. The vacuum tube is usually biased for class C or class D operation in order to achieve high efficiency of operation. The RF amplifier does then operate quite efficiently (on the order of 75% efficiency), but also inherently requires a large amount of modulation power. For example, a five kilowatt RF amplifier of this type requires nearly 2.5 kilowatts of audio modulating signal power. High power audio amplifier stages are used to amplify the audio modulating signal to the required levels.

In the art these high power audio amplifiers are referred to as "modulators". This is somewhat different than the classical meaning of the term "modulator", since the actual RF carrier modulation occurs in the final RF amplifier stage rather than in the audio amplifier stage. To avoid confusion the term "modulator" is instead used herein in its classical sense to mean a device for varying a characteristic of a carrier signal.

Past attempts to improve the overall efficiency of operation of the RF modulating systems have been directed to improving the efficiency of the high power audio amplifier stages. It would be preferable, however, if an RF modulation system could be devised which did not require such high levels of audio modulating power in the first place.

The situation is somewhat analogous in the TV broadcasting art. Video signals are broadcast as AM signals. Class C and D amplifiers are not used in the final RF amplifier stages of TV transmitters, however, because they are nonlinear. Class AB amplifiers, which are linear, are therefore usually used instead. Although class AB modulators do not require that the modulating signal be provided at a substantial power level, they are relatively inefficient in operation, exhibiting efficiencies on the order of 20%. Efficiency of operation is important, however, since TV transmitters may have transmitter power output ratings as high as 1 megawatt. Needless to say, the cost of the electricity required to power these transmitters is significant. It would be desirable if a linear amplitude modulator of high efficiency could be developed.

An additional difficulty with prior RF modulator designs relates to their incompatibility with solid state amplifier elements. As mentioned above, the final RF amplifier stages of high power amplitude modulators have historically employed large vacuum tubes. It would be desirable if these vacuum tubes could be replaced by solid state amplifier elements. Solid state amplifier elements, such as BJT's, FET's, SCR's, etc. are preferred over vacuum tube devices in view of their size, relative efficiency, and reliability. Unfortunately the semiconductor elements currently available cannot readily be incorporated into past RF modulator designs.

SUMMARY OF THE INVENTION

It is an object of the present invention to provide a new and improved modulator which uses smaller amounts of modulating signal power than generally required in the past.

It is another object of the present invention to provide a modulator design which may be readily implemented utilizing solid state amplifier elements.

It is yet another object of the present invention to provide a carrier modulator which is characterized by high efficiency of operation.

It is still another object of the present invention to provide a high efficiency RF amplifier which is linear, for use, e.g., in video transmitters.

In accordance with the present invention, method and apparatus are provided for generating a modulated carrier signal. The apparatus includes means adapted to respond to an input signal for providing a plurality of carrier signals of like frequency and phase, where the number of carrier signals being provided varies as a function of the value of an input signal. Means are also provided for combining the plurality of carrier signals to thereby form a combined carrier signal having an amplitude which varies in accordance with the input signal.

BRIEF DESCRIPTION OF THE DRAWINGS

The foregoing and other objects and advantages of the present invention will become more readily apparent from the following detailed description, as taken in conjunction with the accompanying drawings, wherein:

FIG. 2 is a circuit schematic of one of the carrier signal sources of the modulator of FIG. 1;

FIG. 2A is a simplified circuit schematic useful in understanding the operation of the FIG. 2 circuit;

FIG. 3 is a block diagram of a modulator embodiment employing a level detector as an input signal digitizer;

FIG. 7 is a block diagram of a modulator embodiment responsive to an input signal which is already digitized and which uses a different type of carrier signal combiner;

FIG. 8 is a block diagram of a transmitter using the modulator of the present invention and incorporating various types of modulation error correction;

DETAILED DESCRIPTION

Figure 1:
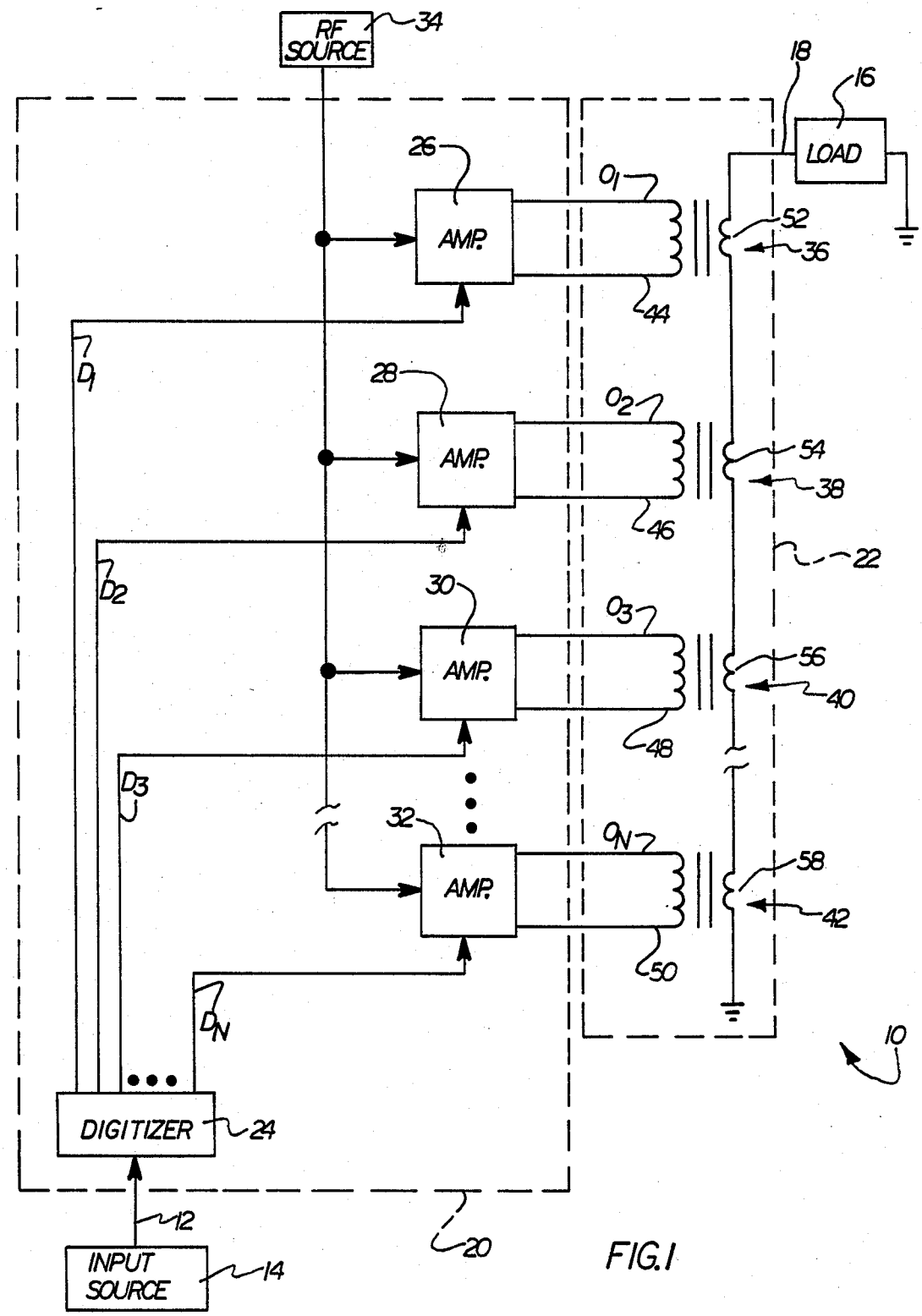
FIG. 1 is a block diagram of one embodiment of a modulator in accordance with the teachings of the present invention.

An amplitude modulator 10 in accordance with the present invention is shown in FIG. 1. The modulator has an input line 12 for receiving an input signal from an input source 14. The modulator 10 generates an RF carrier signal which is amplitude modulated as a function of the amplitude of the input signal. The amplitude modulated carrier signal is provided on an output line 18, to which is connected a load 16. The amplitude modulator 10 can be thought of as comprising two elements: a circuit 20 which provides a plurality of carrier signals of like frequency and phase, where the number of carrier signals being provided is dependent upon the level of the input signal, and a combiner circuit 22 which combines the carrier signals to thereby generate the amplitude modulated carrier signal.

In FIG. 1 the circuit 20 which provides the carrier signals is shown as including a digitizer 24 which converts the input signal into a plurality of digital control signals. The digital control signals are provided on N output lines designated in FIG. 1 as $D_1$–$D_n$. The control signals have values which vary in accordance with the instantaneous level of the input signal. In FIG. 1 and the embodiments which follow, the control signals are binary signals and the number of control signals having a given binary value (i.e., logic "1" or logic "0") varies in accordance with the amplitude of the input signal provided by the input source 14. For example, the number of control signals having a logic "0" value may be directly dependent upon the instantaneous level of the input signal.

Each of the output lines $D_1$–$D_n$ is connected to a corresponding one of N carrier signal sources, four of which are represented at 26, 28, 30 and 32. Each carrier signal source provides a carrier signal at its output when the respectively associated control signal has a first value. In FIG. 1 the signal sources 26–32 take the form of RF power amplifiers which each amplify the RF signal provided by a single common RF source 34, and each of which is controlled by the binary value of the control signal appearing on the corresponding digitizer output line $D_1$–$D_n$. When the control signal has a binary value of "0" the power amplifier is active, and an amplified carrier signal is provided upon its output. When the control signal has a binary value of "1", the power amplifier is inactive, and no signal is provided across its output lines. The carrier signals provided at the output of the plural power amplifiers will be of like frequency and phase, so long as care is taken to insure that phase delays produced in circuit paths between the RF source and the power amplifiers are equalized.

The combiner circuit 22 is shown in FIG. 1 as comprising a plurality of transformers 36, 38, 40 and 42 each having its primary winding 44, 46, 48 and 50 connected across the output of a corresponding one of the power amplifiers 26, 28, 30 and 32. The secondaries 52, 54, 56 and 58 of the various transformers are connected in series with one another across the output line 18. Each secondary acts as an independent signal source, whereby the signals provided by the various transformers additively combine with one another to produce a combined signal across the output line 18. The combined signal has the same frequency as the RF signal provided by the RF source 34. The amplitude of the combined signal is modulated in accordance with the input signal provided by the input source 14 because the number of amplified carrier signals provided by the power amplifiers is controlled by the level of the input signal.

The input signal will usually include both AC and DC components. The DC component of the input signal sets the DC carrier level and will normally be adjusted so that a selected number of power amplifier stages are active even when no AC component is present.

The amplitude modulator which has thus been described may be used in any application in which amplitude modulators have heretofore found use. It is particularly advantageous in use as a high powered amplitude modulator in AM radio or TV broadcasting. In applications such as this, the input source 14 comprises the source of the audio or video signal and the load 16 comprises the antenna network which broadcasts the amplitude modulated signal.

FIG. 2 illustrates one form which the power amplifier of FIG. 1 may take, the other power amplifiers 28, 30 and 32 being similar. The power amplifier illustrated includes four semiconductor amplifier elements 70, 72, 74 and 76 connected in a bridge arrangement across a DC power supply voltage of, for example, 250 volts. The primary winding 44 of the associated transformer 36 is connected across the bridge junctions $J_1$ and $J_2$ of the four semiconductor elements.

More particularly, the semiconductor amplifier elements are metal oxide semiconductor, field effect transistors (MOSFETs') having three electrodes, conventionally identified as the gate, drain, and source. The drain-source paths of the transistors 70 and 72, representing their primary current paths, are connected in series across the DC power supply, as are the drain-source current paths of transistors 74 and 76. The primary winding 44 of the corresponding combiner transformer 36 is connected in series with a DC blocking capacitor 78 across the common junctions $J_1$ and $J_2$ between transistors 70 and 72 and transistors 74 and 76.

The transistors 70, 72, 74 and 76 effectively operate as switches to connect the two sides of the primary winding 44 to either the DC voltage source or to ground. By proper operation of these transistors, the transformer winding 44 can be connected in either direction across the DC power supply.

This can perhaps be more readily understood by reference to FIG. 2A, which is a simplified illustration of the FIG. 2 circuitry. In FIG. 2A the transistors 70, 72, 74 and 76 are respectively characterized by conventional single pole, single throw switches $S_1$, $S_2$, $S_3$ and $S_4$. As shown in FIG. 2A, the switch $S_1$ is open and the switch $S_2$ is closed, whereby the common junction $J_1$ between them is grounded. The switch $S_3$ is closed and the switch $S_4$ open, however, whereby the junction $J_2$ between those switches is connected to the DC supply voltage. Current will therefore pass through the primary winding 44 in the direction indicated by the arrow 80.

When all four switches $S_1$–$S_4$ are thrown to their opposite states, current will pass through the output winding 44 in the opposite direction. Thus, when switches $S_1$ and $S_4$ are closed and switches $S_2$ and $S_3$ opened, junction $J_1$ is connected to the DC supply and junction $J_2$ is connected to ground. In this case the current through the primary winding 44 of the transformer is in a direction opposite to that indicated by arrow 80 of FIG. 2A. An AC signal can thus be applied across the coil 44 by cyclically switching the switches $S_1$–$S_4$ between these two alternate states. If this is done at RF frequencies, then an RF carrier signal results.

Referring back to FIG. 2, the transistor switches 70, 72, 74 and 76 are controlled by signals applied to their gate electrodes. The gate signals for all four transistors are derived from individual secondary windings of a single transformer. This transformer has a toroidal ferrite core with a primary winding 82 and four secondary windings 84, 86, 88 and 90 wound around it. The turns ratio of the transformer is 1:1, whereby the same signal appearing at the primary is applied to each of the circuits connected to the four secondary windings.

Each of the four secondary windings is connected between the gate and source electrodes of an associated one of the MOSFETs 70-76. The secondary 84 is directly connected between the gate of MOSFET 70 and junction $J_1$, while secondary 88 is similarly directly connected between the gate of MOSFET 74 and junction $J_2$. The secondary windings 86 and 90 are in like manner connected between the gate and source electrodes of MOSFETs 72 and 76, however in these cases impedance networks 92 and 94 are connected in series with the coils 86 and 90, respectively. Each impedance network 92, 94 includes a parallel combination of a resistor 96, 98 and capacitor 100, 102. The purpose of these impedance networks will be described hereinafter during the description of the amplifier control circuitry 104.

The primary winding 82 of the toroidal transformer is connected to the output of the RF source, indicated at 34 in FIG. 1, which provides a sinusoidal RF driving voltage to the power amplifier. Each MOSFET turns on when the RF signal applied to its gate is "on" its positive half cycle and "off" when the applied signal is on its negative half cycle. The MOSFETs therefore cyclically turn on and off at a frequency and phase of the applied RF gate signal. The windings 84 and 90 are connected across MOSFETs 70 and 76 in similar directions whereby the signals appearing at the gates of these transistors are in phase with one another. MOSFETs 70 and 76 therefore turn on and off in unison. Windings 86 and 88, on the other hand, are connected across MOSFETs 72 and 74 in a direction opposite to the direction of connection of windings 84 and 90. The signals applied to the gates of MOSFETs 70 and 76 are therefore 180° degrees out of phase with respect to the signals applied to the gates of transistors 74 and 72. Consequently, when transistors 70 and 76 are "on", transistors 72 and 74 are "off", and vice versa.

Due to the nonlinear transfer characteristics of the MOSFETs 70, 72, 74 and 76, the MOSFETs will abruptly turn on and off in response to the applied sinusoidal signal, rather than linearly following it. The signal applied across the junctions $J_1$ and $J_2$ will therefore have essentially a squarewave form, though at the frequency of the applied RF input signal. The load 16 to which the output of the combiner circuit 22 of FIG. 1 is connected will generally be frequency selective, and will select only the fundamental component of this squarewave.

As shown in FIG. 2, the power amplifier 26 includes a switching circuit 104 for turning the power amplifier on and off in response to the control signal appearing on the digitizer output line $D_1$. The switching circuit 104 includes an NPN bipolar junction transistor 106 having its emitter grounded and its collector connected to the gates of MOSFETs 72 and 76 through corresponding diodes 108 and 110. The base of the transistor 106 is connected to the $D_1$ output of the digitizer 24 through a base resistor 112. When the control signal applied to the base resistor 112 has a high logic level (i.e., logic "1"), base current is applied to the transistor 106, forcing it into saturation. The gates of the transistors 72 and 76 are then effectively grounded through the corresponding diodes 108 and 110. This has the effect of clamping the gate signals of these transistors to a ground potential, thereby forcing both of them to remain in an "off" condition. The primary winding 44 is thus effectively disconnected from ground, thereby turning off the power amplifier. When the control signal $D_1$ applied to the emitter resistor 112 has a low logic level (i.e., logic "0"), however, the transistor 106 is cut off and the operation of the amplifier 26 is substantially as described previously.

The resistors 96 and 98 in the gate circuits of MOSFETs 72 and 76 limit the DC current through transistor 106 when it is saturated. Were these not included the current through the transistor 106 would be quite high because the windings 86 and 90 act as voltage sources. The capacitors 100 and 102 bypass the resistors, reducing their effect at RF frequencies. A third capacitor 114 is connected between both capacitors 100 and 102. This capacitor improves the turn-on/turn-off characteristics of the amplifier.

FIG. 3 illustrates an amplitude modulator as shown in FIG. 1, but employing one specific type of digitizer 24. As in the FIG. 1 circuit, the circuitry of FIG. 3 includes a combiner 22 and multiple stages of power amplifiers, indicated collectively at 120. An RF source 34 provides an RF signal to each of these stages. In FIG. 3 the digitizer 24 takes the form of a circuit conventionally referred to as a level detector. Level detectors are available as integrated circuits having an input line upon which an analog signal can be applied and plural output lines (e.g., 10) upon which binary signals appear in response to the analog input signal. One such integrated circuit is manufactured by Texas Instruments and is referred to by the designation TL490, however other such level detector circuits are also readily available.

When the instantaneous level of the input signal is at the lowest level representable by the level detector (i.e., negative full scale), all of the output lines of the level detector will be high. If the input signal is then steadily increased, first one and then more of the output lines will shift to a low logic level. At any given time the number of low output lines will correspond with the level of the input signal.

Such level detector circuits may be cascaded so as to provide any desired number of output lines and thereby provide any desired level of resolution. Regardless of the number of output lines, the operation is the same. The number of output lines carrying low logic level signals will be dependent upon the instantaneous level of the input signal. In the example shown in FIG. 3, the level detector 122 is shown as including 40 output lines, each directed to a corresponding power amplifier for controlling its operation. This embodiment therefore provides 40 steps of resolution since anywhere between 0 and 40 of the power amplifiers may be active at a given moment, with the actual number being linearly dependent upon the instantaneous amplitude of the applied input signal. In other applications, of course, the total number of amplifier stages may be much larger or smaller than 40.

Figure 4:
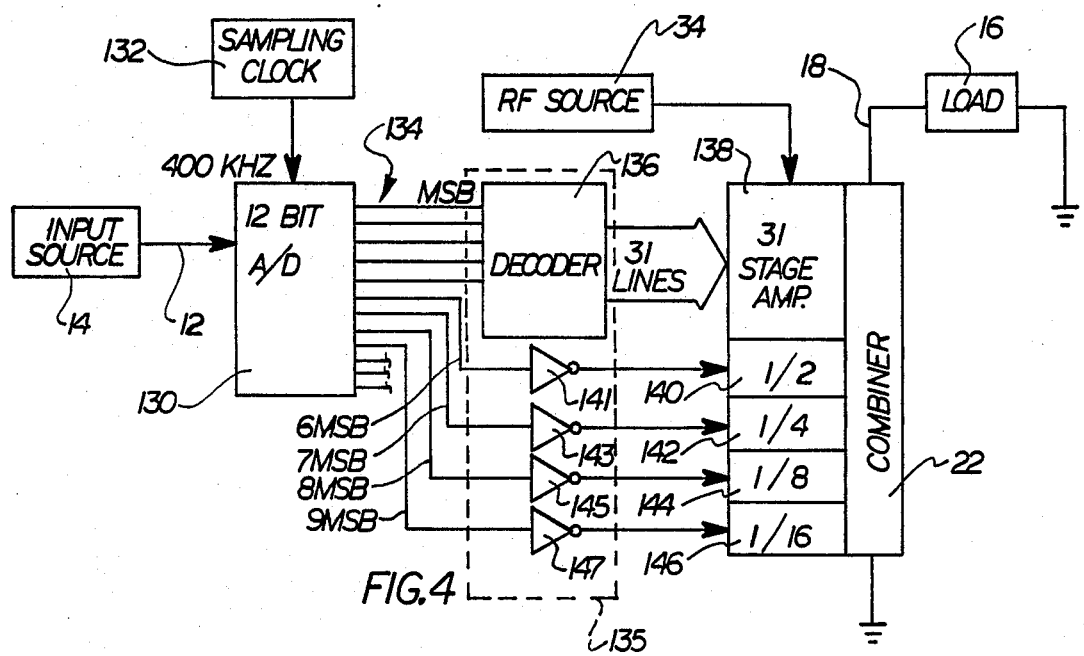
FIG. 4 is a block diagram of a modulator embodiment utilizing an analog/digital converter as part of the digitizer.

FIG. 4 illustrates another embodiment of a modulator in accordance with the teachings of the present invention, utilizing a different technique for digitizing the input signal provided by the input source 14. In this embodiment the input line 12 is directed to an analog-to-digital (A/D) converter 130. A sampling clock 132 provides pulses to the "convert" input of the A/D converter at a 400 kHz rate. Each time a sample pulse appears at the convert input to the A/D, the converter translates the analog input signal into a 12 bit binary output signal, provided on twelve output lines 134. This sampling rate is selected in accordance with the expected frequency range of the input signal. Where the signal provided upon the input line 12 is an audio signal, the sampling clock may have a frequency of 400 kHz, as illustrated. If the input signal is a video signal, however, the sampling rate will be much higher.

In FIG. 4 a code converter 135 is used to convert the 12 bit binary signal into suitable bilevel control signals. The five most significant bits of the 12 bit output of A/D converter 130 are directed to a decoder circuit 136. The decoder circuit 136 decodes the five bit word represented by these five most significant bits and provides a low logic level signal on a number of output lines corresponding with the binary value of this word. Since the maximum binary value of a five bit binary word is 31, there are 31 output lines upon which signals may be provided. The decoder 136 may, for example, comprise a solid state read-only memory (ROM) having five address lines and 31 output lines and programmed with the desired address versus output characteristic. Each of the 31 output lines of decoder 136 is directed to and controls a corresponding one of 31 stages of power amplifiers 138. These 31 stages will preferably be similar to one another, whereby each of the 31 lines controls the contribution of an equivalent increment of carrier level.

The four next-most-significant bits (i.e., 6MSB–9MSB) of the 12 bit binary word provided at the output of A/D converter 130 are directed to corresponding individual power amplifier stages 140, 142, 144 and 146, respectively, through corresponding logic invertors 141, 143, 145 and 147. Each of these four power amplifier stages is structurally similar to each of the 31 stages controlled by the decoder 136, but has a modified DC supply voltage and/or output transformer turns ratio. The net effect of the modification is that each of the stages 140, 142, 144 and 146, when active, contributes less power to the combined carrier signal than the preceding stage. The amount of power contributed by stages 140 and 142 is reduced by increasing the turns ratios of their output transformers. Whereas the output transformer for each of the thirty one stages of power amplification represented by reference numeral 138 in FIG. 4 has a turns ratio of 11:1, for example, the output transformer for stage 140 has a turns ratio of 22:1, and the output transformer for stage 142 has a turns ratio of 44:1. Stages 140 and 142 therefore respectively contribute only ½ and ¼ of the power contributed by each of the preceding thirty one stages. Stage 144 has an 11:1 turns ratio like the thirty one upper stages 138, but has a supply voltage which is reduced from 250V to 30VDC. Consequently, when active, stage 144 contributes only one half the power of stage 142. Stage 146 has not only a reduced power supply voltage (30V), but also an increased turns ratio (22:1) whereby it contributes but half the power of stage 144.

This weighting of the magnitude of the signals contributed by the power amplifier stages 140–146 cooperates with the binary-valued nature of the word provided by the 6MSB–9MSB bits of the output of A/D converter 132 to contribute an incremental signal to the combined carrier signal which is only a selected fraction of the amount of power which would be contributed by one of the thirty one preceding stages. This increases resolution by a factor of 16 while using only four additional stages of power amplification.

The operation of the FIG. 4 circuitry may be illustrated as follows. Consider that the stage 146 contributes 1X of output power to the combined carrier signal. Since stage 144 contributes twice as much power, it, then, may be considered to contribute 2X of output power. Similarly, stages 142 and 144 may be considered to contribute 4X and 8X in output power, whereas each of the stages of the 31 stage amplifier 138 contributes 16X. Presume that the nine most significant bits of the output word provided by A/D converter 130 are: 010011101. This binary word has a binary value of 157. The five most significant bits (i.e., 01001) are provided to the decoder 136, which will respond by providing a low logic level signal on a number of its output lines corresponding to the binary value of the five bit word provided at its input, which in this case is nine. Consequently, nine stages of the thirty one stage amplifier represented by reference number 138 in FIG. 4 will be active and will thus be contributing to the combined carrier signal provided by the combiner 22. The total power of this signal will be nine times the power of each individual stage, or 144X. Since the four next most significant bits provided by converter 130 are "1101", the inverters will provide control signals of low, low, high and low to stages 140, 142, 144, and 146. All of stages 140, 142 and 146 will then be active, whereas stage 144 will be inactive. Stage 140 will contribute 8X to the output signal, and stages 142 and 146 will respectively contribute 4X and 1X to the output signal. The combined signal represents the additive sum of these and 144X, for a total of 157X. Thus, the output signal has a level which corresponds with the binary value of the digital word provided at the output of A/D converter 130.

The embodiments described with respect to FIGS. 1–4 have linear transfer characteristics, in that the amplitude of the carrier signal provided by the combining circuit 22 is proportional to the amplitude of the input signal. A linear transfer characteristic of this nature is desirable in most instances. It may be desirable in some situations, however, to provide the system with a nonlinear transfer characteristic whereby the amplitude of the signal provided by the combining circuit 22 is nonlinearly representative of the input signal. This may be accomplished by providing the amplifier stages with differing power gains, by including a nonlinear circuit between the input source and the digitizer, by designing the digitizer to have a nonlinear transfer characteristic, or in any other convenient manner.

Figure 5:
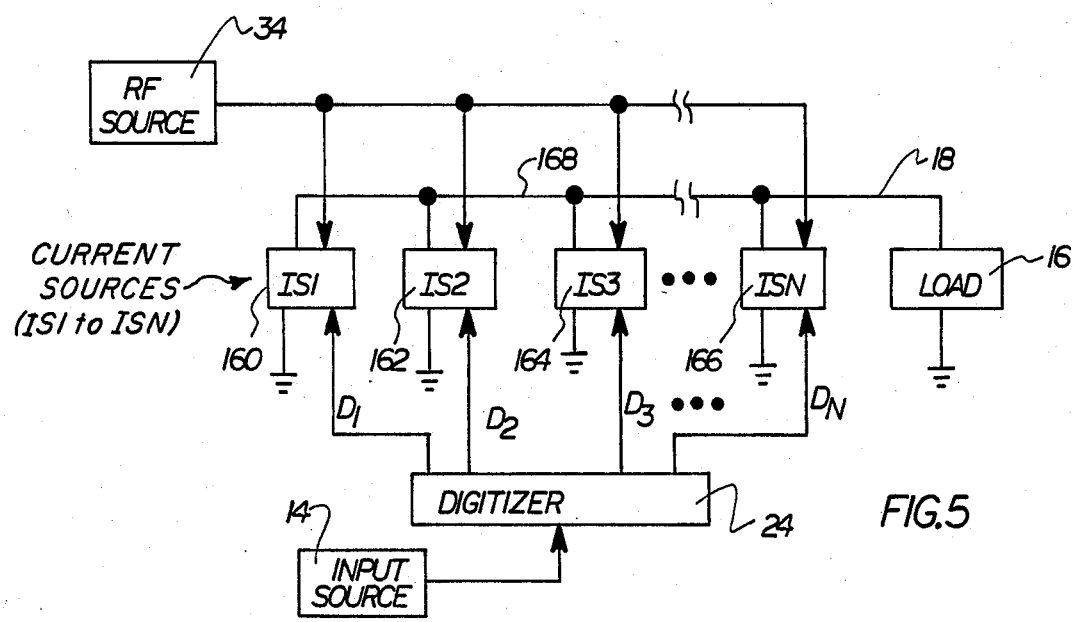
FIG. 5 is a block diagram of a modulator embodiment utilizing plural current sources.

Also, although the embodiments described above have employed voltage sources connected in series, the invention is equally applicable to current sources connected in parallel. One embodiment of such an amplitude modulator is illustrated in FIG. 5. In this Figure the modulator is again shown as including an input source 14, a circuit for providing plural carrier signals including a digitizer 24 and plural carrier sources 160–166, and a combiner, which in this case consists of a connection 168 connecting the various carrier sources in parallel with one another and across the load 16. In FIG. 5 the carrier sources 160–166 comprise controlled current sources which provide AC current signals in accordance with an RF signal provided by an RF source 34. The current sources are turned on and off by the control signals provided by the digitizer 24. Since the individual current sources 160–166 are connected in parallel with one another, their current signals add together. A combined current signal corresponding to the additive sum of the individual currents is therefore provided to the load 16. The digitizer 24 controls the number of current sources which are active at any given time in accordance with the level of an input source 14, whereby the combined signal again has a magnitude dependent upon the magnitude of the input signal provided by the input source 14.

Figure 6:
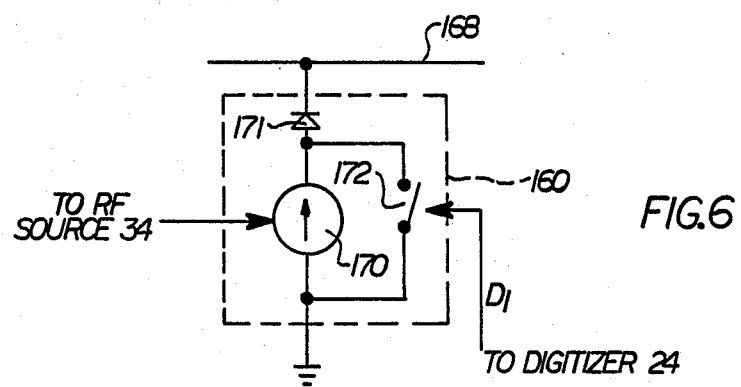
FIG. 6 is a block diagram of one of the controlled current sources of the FIG. 5 embodiment.

The carrier source 160, which is exemplary of the remaining stages, is shown in greater detail in FIG. 6. Here the carrier signal generator is illustrated as a current source 170 which is controlled by the RF signal provided by the RF source 34. The output of current source 170 is connected to the conductor 168 through a diode 171. The RF current signal provided across the terminals of current source 170 is gated by a transistor switching circuit, characterized in FIG. 6 for convenience of description as a single-pole/single-throw switch 172. The switch 172 is connected across the current source 170 and, when closed, provides a short circuit across source 170. The current source is then shorted out, whereby it does not contribute to the combined carrier signal. The diode 171 prevents the combiner signal from being similarly shorted when switch 172 is closed. The position of the switch is controlled by the control signal provided on line $D_1$ by the digitizer 24. When the control signal is low the switch is open, as shown. The output of the current source 170 is then directed to the conductor 168 through diode 171, hence its signal contributes to the combined carrier signal provided to the load 16. When the control signal is high, however, the switch 172 is closed and the output of the current source 170 is returned to ground. The current source is then effectively decoupled from the conductor 168. In this case the stage 160 contributes nothing to the combined carrier signal provided to the load.

FIG. 7 illustrates an embodiment of the invention which is quite similiar in many respects to the embodiment of FIG. 1, but which is adapted to respond to an input signal which is already digitized, and which utilizes a different combiner circuit.

In the previous embodiments, the input signal used to amplitude modulate the RF carrier signal was described as analog in nature. In some circumstances the input signal may already be in digitized form. There are recording systems currently available which record analog signals on a magnetic tape or other recording medium in a digital format. Digital recording techniques such as this have a number of advantages, including reduced noise and increased dynamic range. Conventionally, the output of a digital recorder is converted back to an analog signal before being utilized. When used with the present invention, however, there is little point in converting the digital signal back to an analog signal since it will be digitized thereafter anyhow. In recognition of this, the FIG. 7 embodiment is adapted to directly receive the digital signal without reconversion back to analog.

In FIG. 7 the digital input signal is shown as provided by a digital signal source 200. Although, as described above, this signal source may represent a conventional digital audio recorder, it is also contemplated that it may take other forms. Broadcasting studios are expected to make expanded use of digital signal processing techniques in the future, and any of the digital audio signals generated by such techniques can be directly supplied to the RF modulator 20 for modulating the RF carrier signal.

The circuit 20 which produces the plural carrier signals is shown as including a code converter 202. Code converter 202 converts the digital signals provided by the digital signal source 200 into the plural bi-level control signals used to control the individual RF amplifiers. The code converter 202 may, for example, be a programmed logic array. Another type of code converter has already been described with respect to block 135 of FIG. 4. For each digital word provided by the digital signal source 200, the code converter 202 provides a corresponding multibit binary word at its output, wherein each bit of this word represents one of the bi-level control signals. As in previous embodiments, each of these bi-level control signals is applied to a corresponding one of plural RF amplifiers 204, 206, 208 and 210.

The number of RF amplifiers actually employed will usually be substantially larger than the four shown in FIG. 7. Each of these RF amplifiers amplifies the RF signal provided by the RF source 34 and is controlled by its corresponding control signal such than an amplified RF signal is provided at the amplifier output when the control signal has a first level, and no RF signal is provided at its output when the bi-level control signal has its other level.

The amplifiers 204, 206, 208 and 210 of FIG. 7 have single-ended (unbalanced) outputs all referenced to ground potential. This is somewhat different than in the embodiment of FIG. 1, wherein the amplifiers provided double-ended (balanced) outputs which floated relative to one another. The amplifiers 204–210 of FIG. 7 may correspond to a portion of the amplifier illustrated in FIG. 2. Thus, referring back to FIG. 2, the amplifier 26 may be converted to a single ended output amplifier by eliminating all of the circuitry therein except the semiconductor elements 70 and 72 and their associated gating circuitry. The output of the amplifier would then correspond to the voltage signal appearing at the junction $J_1$.

The RF output signals provided by the plural RF amplifiers are combined in a combiner circuit 22 which has a form somewhat different than that illustrated and described previously. In FIG. 7 the combiner circuit 22 is a conventional 90° RF power combiner, including plural inductors 212, 214, 216 and 218 and a capacitor 220. Each of the inductors connects the output of a corresponding one of the amplifiers to a common signal junction 222. (The inductors will usually be sections of transmission line.) This common signal junction 222 is connected to ground through the capacitor 220. The values of the inductors 212, 214, 216 and 218 and the capacitor 220 are selected so that each RF signal experiences a phase shift of 90° through the combiner. From basic signal theory it can be shown that this arrangement provides an output signal which is the same as if the amplifiers 204, 206, 208 and 210 were connected in series with one another. The output signal therefore represents the additive combination of the RF signals provided by the plural amplifiers. The output of the combiner 22 is taken from the common circuit node 222, and may be connected to any suitable load circuit. In FIG. 7 the load is shown as an antenna network 224.

FIG. 8 is a block diagramatic representation of an embodiment of a transmitter employing the present invention, and utilizing feed-forward and feedback techniques to minimize modulation error. In FIG. 8 the RF modulator 230 corresponds with the circuitry 10 of FIG. 1. This RF modulator 230 receives an RF input from an RF source 232, and derives its modulating input signal from an audio source 234. The audio signal provided at the output 236 of audio source 234 is supplied to the audio frequency input of RF modulator 230 through a variable gain amplifier 238. The variable gain amplifier 238 is included to eliminate RF carrier level variations which would otherwise be introduced by variations in the gain of the DC supply. Each of the RF amplifiers associated with the RF modulator 230 is operated from the same DC supply voltage. Moreover, the amplitude of the RF signal provided at the output of each of the RF amplifiers is directly dependent upon the amplitude of the DC supply signal. Consequently, a change in the level of the DC supply signal will result in a commensurate change in the level of the carrier signal provided at the output 240 of the RF modulator.

Variable gain amplifier 238 has its gain control input 239 connected to the DC supply voltage, whereby its gain also varies in accordance with the level of the DC supply signal. The variable gain amplifier 238 is configured so that its gain is inversely proportional to the DC supply voltage, whereby as the amplitude of the DC supply signal increases, the gain of the audio signal provided to RF modulator 230 diminishes. The gain changes introduced by variable gain amplifier 238 in response to variations in the DC supply voltage will be calibrated to closely match and thereby counteract the gain changes of the RF modulator 230 which are also occasioned by changes in the DC supply level.

The gain stabilization function introduced by variable gain amplifier 238 may be implemented in various alternative ways. The gain of the digitizer portion of the RF modulator 230 may, for example, be controlled in accordance with the level of the DC power supply signal. A/D converters often include a reference input upon which an analog signal is applied to control the gain relationship between the analog input signal and the digital output signal. Consequently, if an A/D converter is used as the digitizer, as in the FIG. 4 embodiment, the DC carrier level control can be implemented by simply varying the level of the reference signal provided to the A/D converter in inverse relationship with variations in the DC supply voltage.

The carrier level stabilization technique shown in FIG. 8 represents an open loop automatic gain correction (AGC) system. A closed loop automatic gain control can readily be provided by detecting the DC level of the transmitted carrier signal and using this DC carrier level signal to control the variable gain amplifier 238.

The transmitter 228 includes feedback introduced by a feedback loop 242 and feed-forward introduced by a feed-forward loop 244. Feedback stabilization is implemented by recovering the audio frequency signal from the modulated RF signal and subtracting a substantially attenuated version of this signal from the audio signal provided on the output 236 of audio signal source 234. In the embodiment of FIG. 8, the high level modulated RF signal generated by the RF modulator 230 is sampled by an inductive coupling loop 246 whose output is connected to the input of an AM detector 248. The AM detector 248 preferably includes a full wave diode detector of conventional form. A filter or equalization network is connected to the output of the diode detector and is designed to eliminate frequencies in excess of, e.g., several thousand Hz. The resulting signal, including both DC and AC portions, is applied upon a feedback line 250. The feedback line 250 connects the output of the detector 248 to the input of variable gain amplifier 238 through a variable resistor 252. A second resistor 254 is connected in series between the output 236 of audio source 234 and the input of variable gain amplifier 238. The feedback signal will therefore add together with the modulating input signal provided by audio source 234 in a ratio determined by the ratio of resistors 254 and 252. Variable resistor 252 may be adjusted so as to adjust the amount of negative feedback provided by the feedback loop 242.

Since the feedback loop 242 is intended to introduce negative feedback, an inversion of the audio signal recovered from the modulated RF carrier signal should take place somewhere in the feedback loop. In a preferred embodiment the polarity inversion is accomplished by suitable connection of the diodes of the detector 248.

The feedback loop 242 provides feedback stabilization of the transmitter and also permits some correction for any nonlinearities occuring in the system. This feedback loop is not capable, by itself, of eliminating the steps in the RF signal which are introduced by switching of the various amplifier stages associated with RF modulator 230, since it provides no mechanism for interpolation between the steps. One method of reducing these RF steps is by including binary stages such as stages 140, 142, 144 and 146 of FIG. 4, each configured to provide a fraction of the step provided by most of the stages in the RF modulator. Another method, which may be either used independently of, or in conjunction with the fractional step technique of FIG. 4, is the feed forward technique of FIG. 8. Generally stated, this technique involves the detection of the extent to which the signal actually modulated on the RF carrier signal differs from the audio signal provided by audio source 234, the modulation of an additional RF carrier signal in accordance with this error signal, and the addition of the resulting modulated carrier signal to the modulated carrier signal provided by RF modulator 230 so as to thereby provide an error corrected modulated RF carrier signal.

In FIG. 8 this is implemented by a circuit 256 which includes an additional, lower power amplitude modulator 258 connected in series between the output 240 of the RF modulator 230 and the load, represented in FIG. 8 as an antenna network 260. The RF input to the amplitude modulator 258 is the RF signal provided by RF signal source 232, whereas the audio frequency signal is an error signal representing the difference between actual and desired modulation produced by RF modulator 230. The amplitude modulator 258 amplitude modulates the RF carrier signal with the error signal, and adds the resulting RF error signal to the output of the RF modulator 230.

The amplitude modulation stage 258 may be of any conventional form, and may, in fact, even comprise additional stages of amplification similar to (though probably of lower power than) those described in respect to the previous Figures. Moreover, amplitude modulator 258 could even be a conventional amplitude modulator since the amount of power introduced thereby is quite small compared to the total overall power of the transmitter. The output of the amplitude modulator 258 may be transformer added to the output of RF modulator 230 in the same fashion as are the individual RF amplifier stages of the RF modulator 230.

The circuit 256 includes a sampling loop 262 disposed adjacent the output 240 of RF modulator 230 for sampling the RF signal provided thereby. The sampling loop 262 is coupled to the input of a detector 264 having a form which is similar to detector 248. Detector 264 thus includes a full wave diode detector for detecting the signal modulated upon the RF carrier signal by modulator 230, and provides an incidental polarity inversion of the signal. Detector 264 also includes an equalization/filter network to filter the detected signal. The filter circuit eliminates higher frequency signals from the detected signal, but has a pass band which is larger than that of the filter associated with detector 248. This is permissible since the time delay in the feed forward loop is smaller than the time delay in the feedback loop, whereby the feed forward loop can correct higher frequency errors than the feedback loop.

The output of the detector circuit 264 is added to the output of the audio signal source 234 by a resistive adder network including a fixed resistor 266 and a variable resistor 268. The two resistors 266 and 268 are connected in series between the output of detector 264 and the output of a time delay circuit 270 whose input is connected to the output 236 of audio source 234. The voltage appearing at the junction 272 of resistors 266 and 268 represents the modulation error voltage. The time delay circuit 270 is included to synchronize the signals appearing across the resistors 266 and 268. Time delay circuit 270 is designed to introduce a time delay corresponding to the time delay produced by the circuitry between the output 236 of audio source 234 and the output of the detector 264.

The value of resistor 268 is variable and will preferably be adjusted so that the DC voltage appearing at the common junction 272 of the two resistors 266 and 268 is normally substantially zero. When thus adjusted, the gain of the circuitry on the two sides of the common junction 272 is equalized. The AC component on both sides of the common junction 272 should then also be of equal and opposite magnitudes, whereby they, also, should cancel. To the extent that the AC components are different, an error signal will appear at the common junction 272. To correct for such error, the common node 272 is connected to the audio frequency input of the amplitude modulation stage 258. The gain of the amplitude modulator 258 is adjusted so that the modulated RF signal provided thereby is the proper amplitude to cancel the error component in the output of the RF modulator 240.

In the embodiments which have been described, the RF signal source has been described as providing a fixed frequency RF signal. This need not necessarily be the case, however. Instead, the RF signal source may be providing an RF signal having a varying frequency or phase, whereby the resulting modulated wave has both a varying amplitude and a varying phase. In fact, the modulator which has been described is well suited for generating such a complex wave, since the bandwidth of the RF amplifiers may readily be designed to be quite broad. This in contrast to conventional AM transmitters, which characteristically exhibit very narrow bandwidth on their RF inputs.

Figure 9:
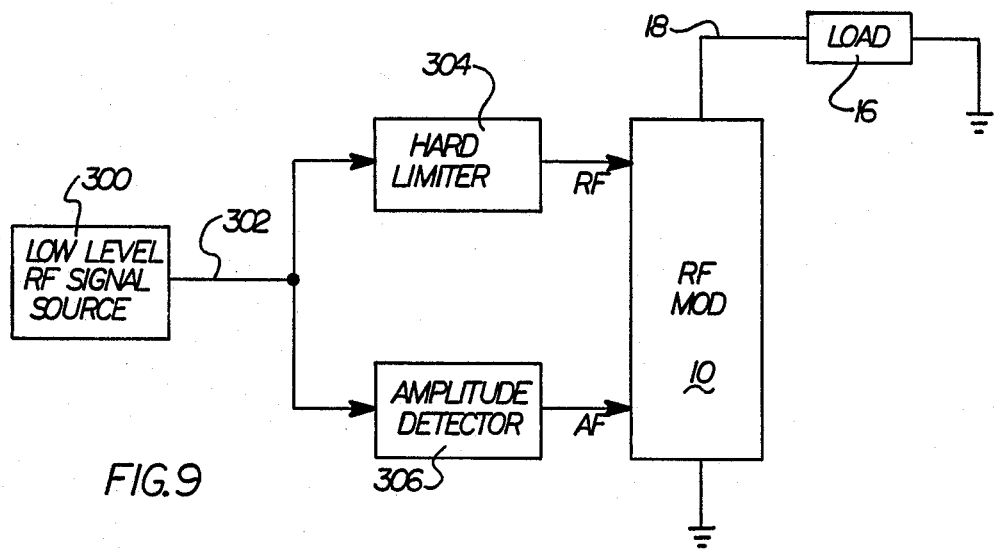
FIG. 9 is a block diagram of a linear RF amplifier incorporating the modulator of the present invention.

FIG. 9 is a block diagram of a transmitter wherein a complex wave, exhibiting both amplitude and frequency variation, is amplified by the RF modulator. In FIG. 9 a low level RF signal source 300 generates a low level complex RF signal. Just by way of example, this low level modulated RF signal may be a single sideband signal, double-side band signal, or vestigial sideband signal. It may also carry more than one information signal, as in the case of a quadrature AM signal, or independent side band signal. Circuitry for generating these many different types of signals is well known in the art and will not be described herein. Whatever the form, this low level modulated RF signal will appear on an output line 302, which is connected to two circuits 304 and 306.

The circuit 304 is a hard limiter which amplifies and limits the RF signal so as to provide at its output a low level RF signal of fixed amplitude, but having a phase and frequency which varies in accordance with the input signal. The circuit 306 is an amplitude detector of conventional form. The amplitude detector detects the amplitude of the low level complex RF wave and provides an output signal indicative thereof.

The RF signal provided by the hard limiter 304 is applied to the RF input of the RF modulator 10, whereas the output of the amplitude detector 306 is applied to the audio frequency input of the RF modulator 10. The RF modulator 10 amplitude modulates the RF signal in the fashion described hereinbefore, thereby producing a high level complex wave at its output 18. The complex wave has an amplitude which varies in accordance with the output of detector 306 and a phase and frequency which follows the output of limiter 304. It therefore represents an amplified version of the low level RF wave provided by the circuit 300.

The combination of the hard limiter 304, amplitude detector 306 and RF modulator 10 represents an efficient, linear RF amplifier which may be used to amplify any low level RF signal. It may be used, for example, to amplify an RF carrier modulated with a video signal.

Figure 10:
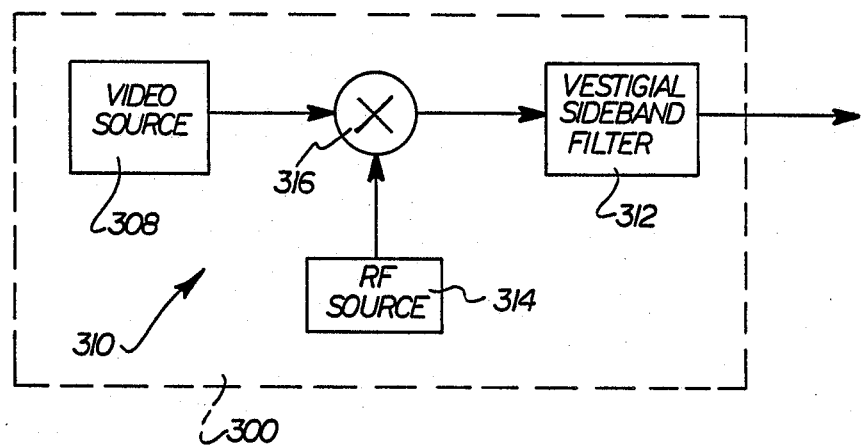
FIG. 10 is a simplified block diagram of a conventional video exciter.

FIG. 10 illustrates in much simplified fashion one conventional form which the low level RF signal source 300 may take to produce the low level video modulated RF signal of this nature. The low level RF signal source 300 is shown as includes a video signal source 308, an amplitude modulator 310, and a vestigial sideband filter 312. In FIG. 10 the amplitude modulator 310 is characterized as a multiplier 316 which multiplies a fixed amplitude and frequency RF signal provided by an RF signal source 314 by the video signal provided by video signal source 308. The output of the multiplier 316 comprises an RF carrier signal amplitude modulated in accordance with the video signal. The amplitude modulated signal is applied to the input of the vestigial side band filter 312 which substantially attenuates one of the side bands of the amplitude modulated signal so as to thereby provide a signal conforming with FCC requirements. (The FCC requires that one of the side bands of the TV signal be substantially attenuated in order to conserve bandwidth.) The resulting low level modulated RF signal includes both amplitude modulation and phase modulation components, and can be efficiently amplified by the apparatus shown in FIG. 9.

An amplitude modulator circuit has therefore been described which does not require that the modulating signal be supplied at a substantial power level. Conventional, inexpensive, off-the-shelf semiconductor devices can be used in the output stage of the modulator, thereby realizing all the advantages attendant with the use of such devices. Moreover, the modulator operates as a linear amplifier and has displayed efficiencies in excess of 80%.

Although the invention has been described with respect to a preferred embodiment, it will be appreciated that various rearrangements and alterations of parts may be made without departing from the spirit and scope of the present invention, as defined in the appended claims.

What is claimed is:

1. Apparatus for generating an amplitude modulated carrier signal, comprising:
   means responding to an input signal for providing a plurality of first carrier signals of like frequency and phase and equal amplitude where the number of said first carrier signals being provided is dependent upon amplitude of said input signal, and for also selectively providing at least one second carrier signal, each said at least one second carrier signal having an amplitude which is a fraction of the amplitude of each of said first carrier signals; and,
   means for combining said first and said at least one second carrier signals so as to provide a combined carrier signal having an amplitude which is modulated in accordance with said amplitude of said input signal.

2. Apparatus as set forth in claim 1, wherein said means for providing said carrier signals comprises:
   means for providing a multibit digital signal which changes in accordance with said input signal; and
   a plurality of carrier signal source means each either providing or not providing an associated one of said first and at least one second carrier signals in accordance with the level of an associated one of the bits of said multibit digital signal, said carrier signals all being of like frequency and phase, said carrier signal source means collectively responding to said digital signal such that the number of said carrier signals being provided varies in accordance with the amplitude of said input signal.

3. Apparatus as set forth in claim 2, wherein said plurality of carrier signal source means are voltage sources.

4. Apparatus as set forth in claim 2, wherein said plurality of carrier signal source means are current sources.

5. Apparatus as set forth in claim 2, wherein said input signal is analog and wherein said digital signal providing means comprises digitizing means responsive to said input signal for digitizing said input signal to provide said multibit digital signal in response thereto.

6. Apparatus as set forth in claim 5, wherein the number of said bits having a first binary lever varies as said input signal varies, and further wherein each of the carrier signal source means which provides one of said first plurality of carrier signals is responsive to an associated one of said bits to provide said one of said first plurality of carrier signals only when said associated bit has said first binary level.

7. Apparatus as set forth in claim 6, including said level detector means providing said multibit digital signal wherein the number of bits having said first binary level varies in proportion to the instataneous amplitude of said input signal.

8. Apparatus as set forth in claim 6 wherein each of the carrier signal source means which provides said at least one second carrier signal is responsive to a portion of said multibit digital signal having a binary value which varies in proportion to the difference between the instantaneous amplitude of said input signal and the input signal amplitude represented by the sum of said first plurality of carrier signals, wherein respective carrier signal source means each provides one of said at least one second carrier signal in response to a corresponding one of the bits of said portion of said multibit digital signal, and wherein each of at least one second carrier signal provided in response to a bit of said portion of said multibit digital signal has an amplitude proportional to the value of the corresponding bit in said portion of said multibit digital signal such that the sum of the amplitudes of each of said at least one second carrier signals follows said binary value of said portion of said multibit digital signal.

9. Apparatus as set forth in claim 2, wherein said input signal is a digital representation of an analog signal, and wherein said digital signal providing means comprises means responsive to said digital representation of said analog signal for providing said multibit digital signal in accordance therewith.

10. Apparatus as set forth in claim 2, wherein said plurality of carrier signal source means comprises a like plurality of current signal source for each providing or not providing associated current signals in accordance with the level of an associated bit of said multibit digital signal, and wherein said combining means comprises means for connecting said current signal sources in parallel with one another.

11. Apparatus as set forth in claim 2, and further comprising a single, common carrier signal source, and wherein said plurality of carrier signal sources comprises a plurality of power amplifiers each responsive to the carrier signal provided by said common carrier signal source for providing or not providing an amplified version of said carrier signal in accordance with said associated one of the bits of said multibit digital signal.

12. Apparatus as set forth in claim 11, wherein said common carrier signal source comprises means for providing a carrier signal having a fixed frequency.

13. Apparatus as set forth in claim 11, wherein said common carrier signal source comprises means for providing a carrier signal having a varying frequency.

14. Apparatus as set forth in claim 11, wherein said common carrier signal source comprises means responsive to a modulated carrier signal exhibiting both frequency and amplitude variations for providing a carrier signal at its output which has a fixed amplitude and a frequency which follows the frequency of said input signal.

15. Apparatus as set forth in claim 11, wherein each said power amplifier comprises four amplifier elements connected in a bridge arrangement across a DC power supply, and means for operating said amplifier elements in accordance with said carrier signal such that said carrier signal appears in amplified form across two junctions of said bridge arrangement.

16. Apparatus as set forth in claim 15, wherein said four amplifier elements are solid state amplifier devices.

17. Apparatus as set forth in claim 15, wherein said combining means comprises plural transformers having their secondary windings connected in series, wherein the primary winding of each said transformer is connected across said two junctions of one of said bridge arrangements.

18. Apparatus as set forth in claim 1, wherein said combining means comprises plural transformers having their secondary windings connected in series, wherein the primary winding of each said transformer is connected to said means for providing said first and at least one second carrier signals so as to receive a corresponding one of said carrier signals.

19. Apparatus as set forth in claim 1, wherein said combining means comprises inductive impedance means for coupling each of said first and at least one second carrier signals to a common circuit node and capacitive impedance means coupled between said common circuit node and circuit ground.

20. Apparatus for generating an amplitude modulated carrier signal, comprising:
   means for receiving an input signal in accordace with which a carrier signal is to be modulated;
   means for providing a plurality of carrier signals of like frequency and phase, said means providing a first plurality of carrier signals, all of equal amplitude, and at least one second carrier signal, each said at least one second carrier signal having an amplitude which is a selected fraction of the amplitude of each of said first pluraltiy of carrier signals; and
   means for combining a selected number of said carrier signals in accordance with the level of said input signal whereby a combined carrier signal is provided which is modulated as a function of said input signal.

21. Apparatus as set forth in claim 20, wherein said means for providing said plurality of carrier signals comprises a plurality of carrier signal sources, each providing one of said plurality of carrier signals at its output.

22. Apparatus as set forth in claim 21, wherein each said carrier signal source is a current source.

23. Apparatus as set forth in claim 21, wherein said means for combining includes means for connecting together the outputs of selected ones of said carrier signal sources so that the carrier signals provided thereby add together to produce said combined carrier signal.

24. Apparatus as set forth in claim 23, wherein each said carrier signal source is a current source, and wherein said means for connecting comprises means for connecting the outputs of selected ones of said current sources in parallel with one another, whereby the current signals provided thereby add together.

25. Apparatus for generating an amplitude modulated carrier signal, comprising:
   means for digitizing an input signal to provide a plurality of control signals wherein the number of control signals having a first level changes as the amplitude of said input signal changes;
   a plurality of carrier signal sources each responsive to an asociated one of said control signals for providing an associated carrier signal when said control signal has said first level, said carrier signals being of like frequency and phase, a first plurality of said sources providing first carrier signals which are all of equal amplitude, and at least one other of said sources providing a carrier signal having an amplitude which is a selected fraction of the amplitude of each of said first carrier signals; and,
   means for combining said associated carrier signals, whereby a combined carrier signal is provided having an amplitude which varies in accordance with said input signal.

26. Apparatus as set forth in claim 25, wherein said means for digitizing comprises digital means for converting said input signal into a digital signal including plural binary bits, wherein each bit serves as one of said control signals.

27. Apparatus as set forth in claim 26, wherein said digital means provides a digital signal wherein the number of bits of said digital signal having said first level is proportional to the amplitude of said input signal.

28. Apparatus as set forth in claim 26, wherein said digital means provides a multibit digital signal having a first portion wherein the number of bits having said first amplitude is porportional to the level of said input signal, and a second portion wherein the binary value of said second portion is porportional to the difference between the input signal amplitude represented by said first portion and the actual input signal amplitude.

29. Apparatus as set forth in claim 28, wherein said digital means comprises an analog-to-digital converter for converting said input signal into a first multibit digital word having a binary value porportional to the amplitude of said input signal, and means for converting a selected number of the most significant bits of said first digital word into a second digital word wherein the number of bits of said second digital word having a first binary level is proportional to the binary value of said most significant bits of said first digital word, whereby said second digital word corresponds to said first portion of said digital signal and the remaining bits of said binary word correspond to said second portion of said digital signal.

30. Apparatus as set forth in claim 29, wherein said means for converting comprises memory means having digital words stored therein, said memory means being addressed by said selected number of the most significant bits of said first digital word to select said second digital word from the stored digital words.

31. Apparatus for generating an amplitude modulated carrier signal, comprising:
   means for digitizing an input signal, said digitizing means being responsive to said input signal for providing a multibit digital signal which changes in accordance with said input signal;
   a plurality of carrier signal sources each responsive to an associated bit of said digital signal for either providing or not providing an associated carrier signal in accordance therewith, said associated carrier signals being of like frequency and phase, where a first plurality of said carrier signals are of equal amplitude and at least one other carrier signal has an amplitude which is a selected fraction of the amplitude of each of said first plurality of carrier signals, said carrier signal sources collectively responding to said digital signal such that the number of said first plurality of carrier signals being provided varies in accordance with the value of said input signal and that said at least one other carrier signal is provided when the amplitude of said input signal is between values represented by discrete numbers of said first plurality of carrier signals; and
   means for combining said associated carrier signals provided by said carrier signal sources, whereby a combined carrier signal is provided having an amplitude which varies in accordance with said input signal.

32. Apparatus as set forth in claim 31, wherein said means for digitizing includes means for providing a digital signal including a plurality of bits wherein the number of said bits having a first level varies linearly in accordance with said input signal, and further wherein each said carrier signal source providing one of said first plurality of carrier signals response to an associated one of said bits to provide an associated carrier signal only when said associated bit has said first level.

33. Apparatus for generating an amplitude modulated carrier signal, comprising:
   means for providing an input signal;

means responsive to said input signal for digitizing said signal to provide a plurality of bilevel control signals where the number of said control signals having a first level changes in accordance with the amplitude of said input signal;

means for providing a carrier signal;

a plurality of power amplifier means, each responsive to said carrier signal and to an associated one of said control signals for providing an amplified version of said carrier signal when said associated control signal has said first level and no signal otherwise; and, means for combining said amplified versions of said carrier signals provided by said plural power amplifier means so as to thereby provide a combined carrier signal having an amplitude which varies in accordance with said input signal;

wherein each said power amplifier means comprises four switching elements connected in a bridge arrangement across a DC power supply, and means for operating said switching elements in accordance with said carrier signal such that said amplified version of said carrier signal appears across the output junctions of said bridge arrangement.

34. Apparatus as set forth in claim 33, wherein said means for providing a carrier signal comprises means for providing a carrier signal or fixed frequency.

35. Apparatus as set forth in claim 33, wherein said means for providing a carrier signal comprises means for providing a carrier signal having a varying frequency.

36. Apparatus as set forth in claim 35, wherein said means for providing a carrier signal having a varying frequency comprises means for providing a modulated carrier signal exhibiting both amplitude and frequency variations, limiter means responsive to said modulated carrier signal for providing a fixed amplitude carrier signal having frequency variations following those of said modulated carrier signal, and coupling means for coupling said fixed amplitude carrier signal to each of said plurality of power amplifier means.

37. Apparatus as set forth in claim 36, wherein said means for providing a modulated carrier signal comprises means for providing at least one input signal, and exciter means for modulating a carrier signal in a desired manner in accordance with said at least one input signal to thereby provide said modulated carrier signal.

38. Apparatus as set forth in claim 33, wherein said combining means comprises a plurality of transformers, each having its primary winding connected across an output of a corresponding one of said power amplifier means, and means for connecting the secondary windings of said transformer in series with one another whereby said combined carrier signal is developed across the series combination of said secondary windings.

39. Apparatus as set forth in claim 33, wherein said carrier signal is an RF signal and further wherein said combining means comprises a 90° RF power combiner.

40. Apparatus as set forth in claim 33, wherein each said power amplifier means comprises a semiconductor power amplifier.

41. A method of generating an amplitude modulated carrier signal, comprising the steps of:

selectively providing a first plurality of equal amplitude carrier signals of like frequency and phase where the number of carrier signals being provided varies with the amplitude of an input signal;

selectively providing at least one second carrier signal, each said at least one second carrier signal having an amplitude which is a selected fraction of the amplitude of each of said first plurality of carrier signals; and, combining said first plurality of carrier signals and said at least one second carrier signal to thereby form a combined carrier signal having an amplitude which varies in accordance with said amplitude of said input signal 42. A method as set forth in claim 41, wherein said step of selectively providing said first plurality of carrier signals comprises the steps of:

digitizing said input signal to provide a digital representation thereof including a preselected quantity of binary bits, and providing one of said first plurality of carrier signals for each of said preselected quantity of bits having a first binary level.

43. A method as set forth in claim 42, wherein said step of digitizing said input signal comprises the step of converting said input signal to a multibit digital signal wherein the number of said preselected quantity of binary bits of said digital signal having said first binary level is proportional to the level of said input signal.

44. A method as set forth in claim 41 wherein said step of providing a first plurality of carrier signals comprises the step of providing carrier signals having a fixed frequency.

45. A method as set forth in claim 41 wherein said step of providing a first plurality of carrier signals comprises the step of providing carrier signals having a varying frequency.

46. A method as set forth in claim 41 wherein said step of selectively providing a first plurality of carrier signals comprises the steps of providing a modulated carrier signal as said input signal, providing a plurality of fixed amplitude carrier signals of equal amplitude having frequencies which vary in accordance with the frequency of said modulated carrier signal, and varying the number of said fixed amplitude carrier signals being provided in accordance with variations in the amplitude of said modulated carrier signal.

47. An amplitude modulation circuit comprising:

a plurality of first radio frequency signal providing circuits each operative to provide a radio frequency signal at its output, all said radio frequency signals being of equal amplitude, each of said first providing circuits being rendered operative in response to control signals applied thereto;

at least one other radio frequency signal providing circuit each operative to provide an other radio frequency signal at its output in response to a control signal applied thereto, said other radio frequency signal being a fraction of the amplitude of each of the radio frequency signals provided by said plurality of first providing circuits;

combiner means for additively combining said radio frequency signals provided by said plurality of first radio frequency signal providing circuits and said at least one other radio frequency providing circuit;

means for synchronizing said first and other radio frequency signal providing circuits so that the output signals of said circuits are in phase; and means responsive to the amplitude of an input signal for selectively applying control signals to said first and other providing circuits so that the radio frequency signal output by said combiner means is amplitude modulated in accordance with the amplitude variations of said input signal.

48. An amplitude modulation circuit as set forth in claim 47 wherein:

said first and at least one other radio frequency signal providing circuits are radio frequency power amplifier circuits;

said synchronizing means comprises means for applying a common radio frequency signal to all said power amplifier circuits so that their output signals are in phase;

said combiner means provides transformer coupling between the outputs of said power amplifier circuits so that the output signals of power amplifier circuits enabled by said control signals are cascaded to produce a combined output signal that is the sum of the enabled power amplifier circuit output signals; and said power amplifier circuit are selectively enabled so that the combined output signal follows the variation in amplitude of the input signal.

* * * * *